US012681102B2

(12) United States Patent
Ikeda et al.

(10) Patent No.: US 12,681,102 B2
(45) Date of Patent: Jul. 14, 2026

(54) METHOD FOR EVALUATING A POWER STORAGE DEVICE AND METHOD FOR PRODUCING THE POWER STORAGE DEVICE

(71) Applicants:Prime Planet Energy & Solutions, Inc., Tokyo (JP); TOYOTA JIDOSHA KABUSHIKI KAISHA, Aichi-ken (JP); PRIMEARTH EV ENERGY CO., LTD., Shizuoka-ken (JP)

(72) Inventors: Hiroaki Ikeda, Toyota (JP); Ayaka Nagano, Hamamatsu (JP)

(73) Assignees: PRIME PLANET ENERGY & SOLUTIONS, INC., Tokyo (JP); TOYOTA JIDOSHA KABUSHIKI KAISHA, Aichi-Ken (JP); TOYOTA BATTERY CO., LTD., Shizuoka-Ken (JP)

( * ) Notice: Subject to any disclaimer, the term of this patent is extended or adjusted under 35 U.S.C. 154(b) by 404 days.

(21) Appl. No.: 18/339,238

(22) Filed: Jun. 22, 2023

(65) Prior Publication Data

US 2024/0012061 A1 Jan. 11, 2024

(30) Foreign Application Priority Data

Jul. 8, 2022 (JP) ................................. 2022-110323

(51) Int. Cl.
| | |
|---|---|
| *G01R 31/389* | (2019.01) |
| *G01R 31/3828* | (2019.01) |
| *G01R 31/3842* | (2019.01) |

(52) U.S. Cl.
CPC ....... *G01R 31/389* (2019.01); *G01R 31/3828* (2019.01); *G01R 31/3842* (2019.01)

(58) Field of Classification Search
CPC ............. G01R 31/389; G01R 31/3828; G01R 31/3842; G01R 27/14; G01R 31/3865; G01R 31/367; G01R 31/385; Y02E 60/10
See application file for complete search history.

(56) References Cited

U.S. PATENT DOCUMENTS

2010/0221602 A1 9/2010 Itou et al.

FOREIGN PATENT DOCUMENTS

| | | | |
|---|---|---|---|
| CN | 102393509 A | * | 3/2012 |
| CN | 102736034 A | | 10/2012 |
| JP | H1164398 A | * | 3/1999 |
| JP | 2000-268887 A | | 9/2000 |
| JP | 2010-205469 A | | 9/2010 |
| JP | 2011-081973 A | | 4/2011 |

(Continued)

*Primary Examiner* — Yossef Korang-Beheshti
(74) *Attorney, Agent, or Firm* — HAUPTMAN HAM, LLP

(57) ABSTRACT

A method for evaluating a connection resistance between a positive current collecting part of an electrode body of a battery and a positive inner terminal member connected thereto includes: changing a power storage device with a first battery voltage by CCCV charging or CCCV discharging into a second battery voltage; obtaining an evaluation value for evaluating the connection resistance by use of at least two values of the following values: CC electric quantity, CV electric quantity, CCCV electric quantity, CC time, CV time, CCCV time, and CV termination current value of the power storage device; and evaluating a connection resistance of the power storage device based on the evaluation value.

6 Claims, 6 Drawing Sheets

(56)     References Cited

FOREIGN PATENT DOCUMENTS

| | | | | |
|----|----------------|---|---|---------|
| JP | 2014044807 | A | * | 3/2014 |
| JP | 2015-205291 | A | | 11/2015 |
| JP | 2018190688 | A | * | 11/2018 |
| JP | 2019-056672 | A | | 4/2019 |
| JP | 2020-098682 | A | | 6/2020 |
| KR | 10-2021-0030089 | A | | 3/2021 |

* cited by examiner

FIG. 6

METHOD FOR EVALUATING A POWER STORAGE DEVICE AND METHOD FOR PRODUCING THE POWER STORAGE DEVICE

CROSS-REFERENCE TO RELATED APPLICATIONS

This application is based upon and claims the benefit of priority to Japanese Patent Application No. 2022-110323 filed on Jul. 8, 2022, the entire contents of which are incorporated herein by reference.

BACKGROUND

Technical Field

The present disclosure relates to a method for evaluating a power storage device and a method for producing the power storage device using the evaluation method.

Related Art

A current collecting part of an electrode body 30 and a terminal member in a power storage device are connected electrically and mechanically for example by ultrasonic welding, laser welding, or swage-bonding. One example of this connection is disclosed in Japanese unexamined patent application publication No. 2011-081973.

SUMMARY

Technical Problems

In the above power storage device, in which the current collecting part and the terminal member are well connected, e.g., welded, to each other, only low connection resistance occurs in the connected portions, such as welded portions, of the current collecting part and the terminal member.

However, it has been found that there is a case where the current collecting part and the terminal member are electrically conducted through their connected portions, enabling charging and discharging of the power storage device, but the current collecting part and the terminal member may be connected insufficiently and thus a high connection resistance occurs between the current collecting part and the terminal member. This power storage device may be unable to exhibit appropriate performance due to the high connection resistance at the connected portions. In addition, the mechanical connection between the current collecting part and the terminal member may not be appropriate, and thus resultant reliability is undesirably low.

The present disclosure has been made to address the above problems and has a purpose to provide a method for evaluating a power storage device to reliably evaluate the level of connection resistance between a current collecting part and a terminal member in the power storage device, and a method for producing the power storage device using the evaluation method.

Means of Solving the Problems (1) To solve the above problems, one aspect of the present disclosure provides a method for evaluating a power storage device by evaluating connection resistance between a current collecting part of an electrode body and a terminal member connected to the current collecting part in the power storage device, wherein the method comprises: changing a device voltage of the power storage device from a first device voltage to a second device voltage by CCCV charging or CCCV discharging; obtaining an evaluation value for evaluating the connection resistance by use of at least two values from among CC electric quantity, CV electric quantity, CCCV electric quantity, CC time, CV time, CCCV time, and CV termination current value of the power storage device, which are obtained in the changing of the device voltage; and evaluating the connection resistance of the power storage device based on the evaluation value.

Meanwhile, as described above, a defective power storage device in which the current collecting part and the terminal member are in contact and electrically conducted through their connected portions, but insufficiently connected, is considered to be able to charge and discharge but have a higher connection resistance in the connection portions than a non-defective power storage device.

Therefore, in the voltage changing process, the constant-current constant-voltage (CCCV) charging or the constant-current constant-voltage (CCCV) discharging is performed on the power storage device having the first device voltage as a device voltage to change the device voltage to the second device voltage.

The CCCV charging and the CCCV discharging refer to charging or discharging defined in the following manner. Firstly, constant current (CC) charging or constant current (CC) discharging is performed using a predetermined constant current until the device voltage reaches a predetermined switching voltage. When the switching voltage is reached, constant voltage (CV) charging or constant voltage (CV) discharging is then performed while maintaining the switching voltage until a) the CV current (CV charging current or CV discharging current) falls below a predetermined CV termination current value, or alternatively, b) a CV time elapsed from switching reaches a predetermined CV termination time. The value of the CV current that flows in the power storage device at the end of CV charging or CV discharging, i.e., at the time when CV is terminated, is referred to as a CV termination current value.

If a defective power storage device with high connection resistance is subjected to CC charging of CCCV charging, the CC electric quantity (i.e., the quantity of electricity in the CC mode) is smaller and the CC time is shorter than those of a non-defective device. This is because the higher the connection resistance, the greater the voltage generated in the connection resistance by the CC current, and a measured device voltage reaches the predetermined switching voltage at an early stage.

Then, when performing CV charging, the defective power storage device with high connection resistance causes the CV electric quantity to be larger and the CV time to be longer than a non-defective power storage device. During CV charging, the CV current that flows is smaller than the CC current, so that the voltage generated in the connection resistance is also smaller. As mentioned above, the defective power storage device is somewhat insufficiently charged, because the voltage generated in the connection resistance is increased and early reaches the switching voltage in the CC charging stage, compared to the non-defective power storage device. Therefore, at the stage of CV charging, it is conceived that CV current flows for a relatively long time until the termination current value is reached in order to charge the electrode body, which was somewhat under-charged.

Alternatively, in the defective power storage device with high connection resistance, the CV termination current value of the current flowing at the end of CV is large. This is because, after switching to CV charging, the CV current value more slowly decreases than in a non-defective power storage device, and the CV termination current value is also large at the end of CV charging, at which the predetermined CV termination time is reached.

In contrast, when a defective power storage device with high connection resistance is subjected to CC discharging out of CCCV discharging, the CC electric quantity is smaller and thus the CC time is shorter than a non-defective power storage device, as in the above-described CC charging. This is because the higher the connection resistance, the greater the voltage generated in the connection resistance by the CC current, and the measured device voltage appears to be low and thus quickly reaches the predetermined switching voltage.

In the subsequent CV discharging, as in the CV charging described above, a defective power storage device with high connection resistance provides a larger CV electric quantity and a longer CV time than a non-defective power storage device. In CC discharging, a CV current that flows is smaller than the CC current, so that the voltage generated in the connection resistance is smaller. Therefore, compared to the non-defective power storage device, the defective power storage device is somewhat under-discharged in the CC discharging stage because the voltage generated in the connection resistance increases and early reaches the switching voltage. In the CV discharging stage, in which the electrode body, somewhat insufficiently discharged, is further discharged, it is conceived that CV current flows for a relatively long time until the termination current value is reached.

Alternatively, in the defective power storage device with high connection resistance, the CV termination current value of the current flowing at the end of CV is large. This is because, after switching to CV discharging, the CV current value more slowly decreases than in the non-defective device, and the CV termination current value is also large at the end of CV discharging, at which the predetermined CV termination time is reached.

In the present disclosure, using the above-described characteristics, the connection resistance of a power storage device is evaluated in the evaluating process by obtaining an evaluation value using at least two values, such as the CC electric quantity, in the evaluation value obtaining process in addition to the voltage changing process. According to the present disclosure, as described above, it is possible to easily evaluate the level of the connection resistance between the current collecting part of the electrode body and the terminal member in the power storage device.

The power storage device may include, for example, a secondary battery, such as a lithium-ion secondary battery, and a capacitor, such as a lithium-ion capacitor.

The electrode body may include, for example, a wound electrode body having a cylindrical or flat shape, consisting of strip-shaped electrode sheets wound with strip-shaped separators interposed therebetween, a lamination electrode body having a rectangular parallelepiped shape, consisting of a plurality of rectangular electrode plates stacked with separators interposed therebetween. The power storage device may contain a single electrode body or multiple electrode bodies.

The current collecting part is used to take out a positive electrode and a negative electrode of the electrode body to the outside. In the wound electrode body, the current collecting part corresponds to a spirally overlapping part of an electrode foil, located at each end in the axial direction and uncoated with an electrode layer. In the lamination electrode body, the current collecting part corresponds to an overlapping part of the stacked electrode foils, protruded in a planar spreading direction perpendicular to the stacking direction and uncoated with an electrode layer.

The connection terminal is a conductive member, which is connected to the current collecting part of the electrode body to take out potentials of the positive electrode and the negative electrode of the electrode body to the outside. The connection terminal may be made of a conductive material, for example, metal, such as aluminum and copper.

As the method for connecting the current collecting part of the electrode body and the connection terminal, any method may be adopted as long as the current collecting part and the connection terminal can be mechanically connected and electrically conducted to each other. For example, this method may include ultrasonic welding, resistance welding, laser welding, and swage bonding.

Evaluating the connection resistance between the current collecting part and the connection terminal is to evaluate the electrical resistance occurring between the current collecting part and the connection terminal. This evaluation may be performed by quality evaluation that determines whether the electrical resistance is good (OK) or not good (NG) or by stratified evaluation that classifies the electrical resistance into three or more ranks.

Further, CC electric quantity, CV electric quantity, and CCCV electric quantity refer to the quantity of electricity charged to or discharged from a power storage device, in the CCCV charging or CCCV discharging mode, by CC charging or CC discharging, CV charging or CV discharging, and their combination, CCCV charging or CCCV discharging.

CC Time, CV Time, and CCCV Time respectively refer to the length of time required for CC charging or CC discharging, CV charging or CV discharging, and CCCV charging or CCCV discharging.

In the evaluation value obtaining process, the evaluation value for the connection resistance to be obtained using at least two measured values, selected from CC electric quantity and others, is a value with which the connection resistance between the current collecting part and the connection terminal can be evaluated. The evaluation value may include for example the quantity ratio of CV electric quantity/CC electric quantity, the time ratio of CV time/CC time, the quantity ratio of CV electric quantity/CCCV electric quantity, the time ratio of CV time/CCCV time, the ratio of the CV termination current value/CC electric quantity, the ratio of the CV termination current value/CC time, their inverse ratios (e.g., the quantity ratio of CC electric quantity/CV electric quantity, etc.), (CC electric quantity–CV electric quantity)×(CC time–CV time).

(2) In the method for evaluating a power storage device, set forth in (1), in the obtaining of the evaluation value, a quantity ratio of CV electric quantity/CC CV electric quantity is obtained as the evaluation value.

In the above-described evaluation method of the power storage device, the evaluation value obtaining process is performed to obtain the quantity ratio of CV electric quantity/CC electric quantity as the evaluation value. As described above, when a defective power storage device with high connection resistance is subjected to CCCV charging or CCCV discharging, the CV electric quantity is larger and the CC electric quantity is smaller than in a non-defective device. Thus, a calculated quantity ratio of CV electric quantity/CC electric quantity of the defective power storage device is larger than that of the non-defective power storage device. Consequently, using the quantity ratio of CV electric quantity/CC electric quantity, the connection resistance of the power storage device can be easily evaluated.

(3) Alternatively, In the method for evaluating a power storage device, set forth in (1), in the obtaining of the evaluation value, a time ratio of CV time/CC time is obtained as the evaluation value.

In the above-mentioned evaluation method of the power storage device, the evaluation value obtaining process is performed to obtain the time ratio of CV time/CC time as the evaluation value. As described above, when a defective power storage device with high connection resistance is subjected to CCCV charging or CCCV discharging, the CV time is longer and the CC time is shorter than in a non-defective device. Thus, a calculated time ratio of CV time/CC time of the defective power storage device is larger than that of the non-defective power storage device. Consequently, using the CV time/CC time ratio, the connection resistance of the power storage device can be easily evaluated.

(4) Furthermore, another aspect of the present disclosure provides a method for producing a power storage device, including sorting the connection resistance of the power storage device by the method for evaluating the power storage device set forth in one of (1) to (3).

According to this method for producing a power storage device, in the process of evaluating the connection resistance, the connection resistance between the current collecting part of the power storage device and the terminal member is evaluated as mentioned above. This method can therefore produce a power storage device appropriately sorted out as the result of evaluation of the connection resistance.

The power storage device sorted in the process of sorting the connection resistance may be addressed according to the evaluation result of the connection resistance. For example, when the connection resistance is evaluated by OK/NG determination that classifies the connection resistance into good (OK) and no-good (NG), a power storage device with a connection resistance evaluated to be OK is advanced to the subsequent production process, whereas a power storage device with a connection resistance evaluated to be NG is eliminated from the production process, or production line. As an alternative, when the connection resistance is evaluated by classification into three or more ranks (e.g., three ranks: A, B, and C), a power storage device may be addressed according to the rank determined in the sorting process. For example, a power storage device with a connection resistance evaluated as rank A is directly advanced to the subsequent production process, whereas a power storage device with a connection resistance evaluated as rank B is advanced to the production process after subjecting to the OK/NG determination in another inspection (e.g., an X-ray test). In contrast, a power storage device with a connection resistance evaluated as rank C is eliminated from the production process, or production line.

BRIEF DESCRIPTION OF THE DRAWINGS

FIG. 6 is a graph showing variations in voltage and current over time during CCCV charging performed on the battery in the second modified example.

DETAILED DESCRIPTION OF THE
EXEMPLARY EMBODIMENTS

Figure 1:
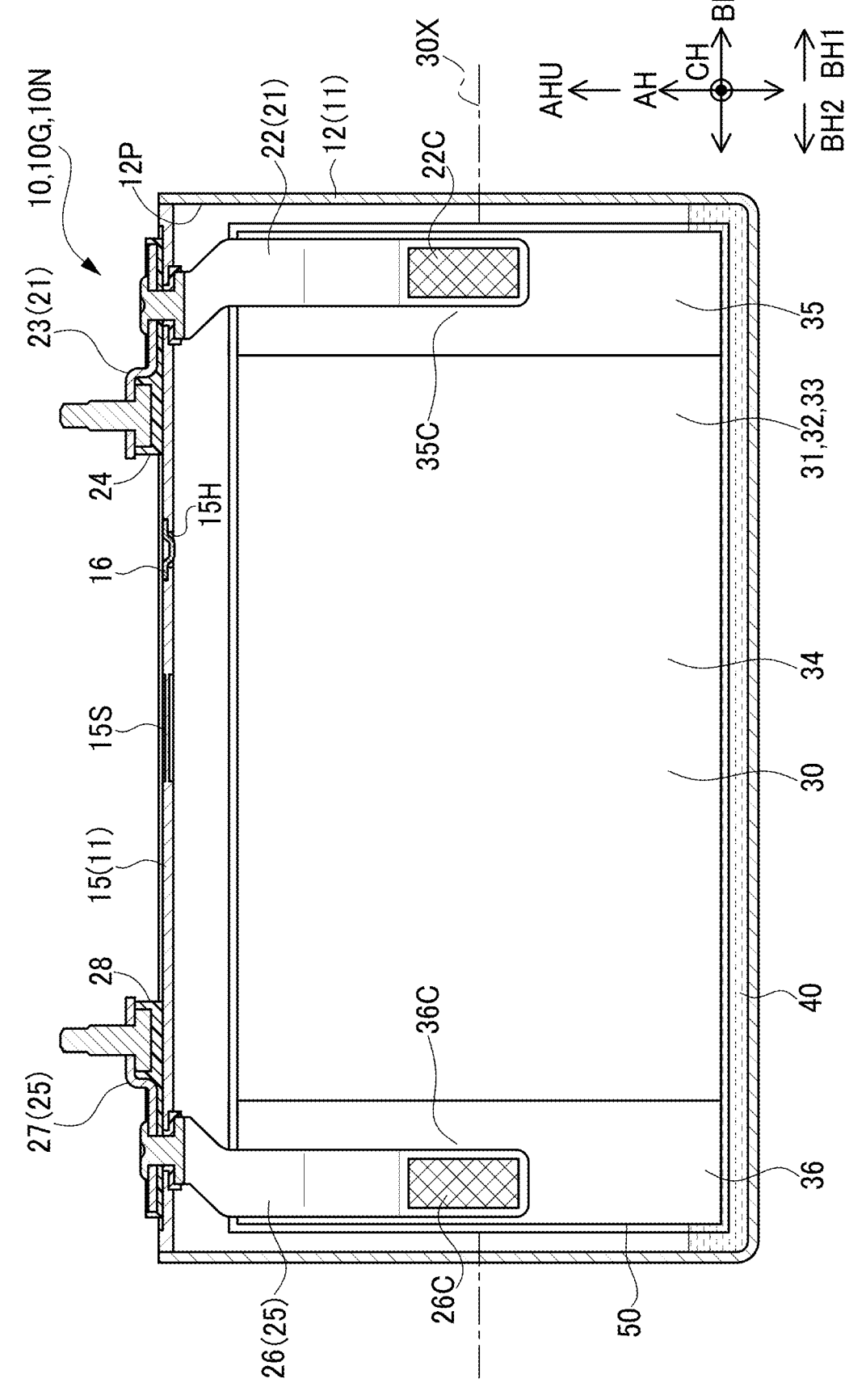
FIG. 1 is a vertical cross-sectional view of a battery in an embodiment and first and second modified examples.

A detailed description of a first embodiment of this disclosure will now be given referring to the accompanying drawings. FIG. 1 is a vertical cross-sectional view of a battery 10 (one example of a power storage device of the present disclosure) in the present embodiment and other examples. In the following description, the battery height direction $\Delta H$ and the battery width direction BH of the battery 10 are defined as illustrated in FIG. 1. Further, the battery thickness direction CH is defined as a perpendicular direction to the drawing sheet of FIG. 1. This battery 10 is, for example, a rectangular, or prismatic, sealed lithium-ion secondary battery to be installed in a vehicle, such as a hybrid car, a plug-in hybrid car, and an electric vehicle.

The battery 10 includes a case 11, an electrode body 30 accommodated in the case 11, a positive terminal 21 and a negative terminal 25 which are supported by the case 11, and others.

The case 11 is made of metal (e.g., aluminum in the present embodiment) in a rectangular parallelepiped box-like shape. This case 11 has a rectangular tubular case body 12 having a closed bottom and an opening 12P that opens on the upper side AHU in the battery height direction AH, and a lid 15 having a rectangular plate-like shape, which is welded to the opening 12P of the case body 12 to close that opening 12P.

The lid 15 is formed with a safety valve 15S, which will break open when the internal pressure of the case 11 rises, and a liquid inlet 15H penetrating through the case 11 for communication between inside and outside of the case 11. This liquid inlet 15H is sealed by a stopper 16.

In addition, the positive terminal 21 made up of aluminum members is fixed to the lid 15 and insulated from the lid 15 by a positive insulating member 24. Specifically, within the case 11, a positive inner terminal member 22 of the positive terminal 21 is connected and electrically conducted to a positive current collecting part 35 (mentioned later) of the electrode body 30 through a connection part 22C. The positive inner terminal member 22 extends, on the other end, through the lid 15 to the outside of the battery 10 and is conductively connected to a positive outer terminal member 23.

Furthermore, a negative terminal 25 made up of copper members is fixed to the lid 15 and insulated state from the lid 15 by a negative insulating member 28. Specifically, within the case 11, a negative inner terminal member 26 of the negative terminal 25 is connected and electrically conducted to a negative current collecting part 36 (mentioned later) of the electrode body 30 through a connection part 26C. The negative inner terminal member 26 extends s, on the other end, through the lid 15 to the outside of the battery 10 and is conductively connected to a negative outer terminal member 27.

In the case 11, there are accommodated the electrode body 30 and an electrolyte 40. A part of the electrolyte 40 is impregnated in the electrode body 30, while the remaining accumulates in the bottom of the case 11. The electrode body 30 is covered with a bottomed rectangular pouch-shaped insulating film 50 that opens on the upper side AHU in the battery height direction AH.

The electrode body 30 is a flat wound electrode body generally having a flat rectangular parallelepiped shape, which is produced in a manner that a strip-shaped positive electrode sheet 31 and a strip-shaped negative electrode sheet 32 are wound together around an axis 30X by interposing two strip-shaped separators 33 formed of a porous resin film, and are pressed in a flat shape. The strip-shaped positive electrode sheet 31 and the strip-shaped negative electrode sheet 32 are one examples of an electrode sheet of the present disclosure.

The strip-shaped positive electrode sheet 31 includes a positive current collecting foil (not shown) formed of a rectangular aluminum foil, and a positive active material layer (not shown) on each main surface of the foil. The strip-shaped negative electrode sheet 32 includes a negative current collecting foil (not shown) formed of a rectangular copper foil, and a negative active material layer (not shown) on each main surface of the foil.

The electrode body 30 is provided with a positive current collecting part 35 on one side BH1 of the axis 30X, i.e., on the right side in FIG. 1, and a negative current collecting part 36 on the other side BH2 of the axis 30X, i.e., the left side in FIG. 1. The positive current collecting part 35 is formed of a spirally wound and exposed part of the positive current collecting foil that forms the positive electrode sheet 31. The negative current collecting part 36 is formed of a spirally wound and exposed part of the negative current collecting foil that forms the negative electrode sheet 32. A middle part between the positive current collecting part 35 and the negative current collecting part 36 along the axis 30X is a main part 34 in which the positive electrode sheet 31 and the negative electrode sheet 32 are wound overlapping with the separators 33 interposed.

In the present embodiment, the positive current collecting foil forming the positive current collecting part 35 of the electrode body 30 includes connection portions 35C tightly contacting with each other in the battery thickness direction CH and welded by laser to a connection part 22C of the positive inner terminal member 22. Accordingly, the positive current collecting part 35 of the electrode body 30 are mechanically bonded to the positive inner terminal member 22 and besides electrically conducted thereto. Thus, the positive current collecting part 35 of the electrode body 30 can be electrically connected to an external circuit member outside the battery 10 through the positive inner terminal member 22 and the positive outer terminal member 23 of the positive terminal 21.

Similarly, the negative current collecting foil forming the negative current collecting part 36 of the electrode body 30 includes connection portions 36C tightly contacting with each other in the battery thickness direction CH and welded by laser to a connection part 26C of the negative inner terminal member 26. Accordingly, the negative current collecting part 36 of the electrode body 30 is mechanically bonded to the negative inner terminal member 26 and besides electrically conducted thereto. Thus, the negative current collecting part 36 of the electrode body 30 can be electrically connected to the external circuit member outside the battery 10 through the negative inner terminal member 26 and the negative outer terminal member 27 of the negative terminal 25.

In addition, the electrode body 30 is supported by the lid 15 through the positive terminal 21 and the negative terminal 25.

As the method for connecting between the connection portions 35C of the positive current collecting part 35 of the electrode body 30 and the connection part 22C of the positive inner terminal member 22 and the method for connecting between the connection portions 36C of the negative current collecting part 36 and the connection part 26C of the negative inner terminal member 26, any methods other than the above-mentioned laser welding may be adopted; for example, ultrasonic welding or swage bonding.

However, as described above, there is a case where the positive current collecting part 35 and the positive inner terminal member 22 are conducted but insufficiently connected to each other and thus a high connection resistance occurs between the positive current collecting part 35 and the positive inner terminal member 22. Similarly, there is a case where the negative current collecting part 36 and the negative inner terminal member 26 are conducted but insufficiently connected to each other and thus a high connection resistance occurs between the negative current collecting part 36 and the negative inner terminal member 26. In the following, the connection resistance between the positive current collecting part 35 and the positive inner terminal member 22 and the connection resistance between the negative current collecting part 36 and the negative inner terminal member 26 will be referred together to as a connection resistance Rc generated in the battery 10.

In the present embodiment, the connection resistance Rc occurring in the battery 10 is evaluated as below, referring to FIG. 2. Specifically, a DC power supply 100 is connected to the battery 10, and CCCV charging is implemented. To be concrete, firstly, a positive supply terminal 100P of the DC power supply 100 is connected to the positive terminal 21 of the battery 10 through a probe 110P. In addition, a negative supply terminal 100N of the DC power supply 100 is connected to the negative terminal 25 of the battery 10 through a probe 110N. Then, the battery 10 is subjected to CCCV charging using the DC power supply 100 to change the battery voltage Vb from a first battery voltage Vb1 to a second battery voltage Vb2.

This DC power supply 100 includes a power supply unit 101 that functions as a constant voltage source and a constant current source, a current measurement unit 102 that measures the battery current Ib flowing from the DC power supply 100 to the battery 10 and feeds back measurement results to the power supply unit 101, and a voltage measurement unit 103 that measures the battery voltage Vb and feeds back measurement results to the power supply unit 101.

Figure 2:
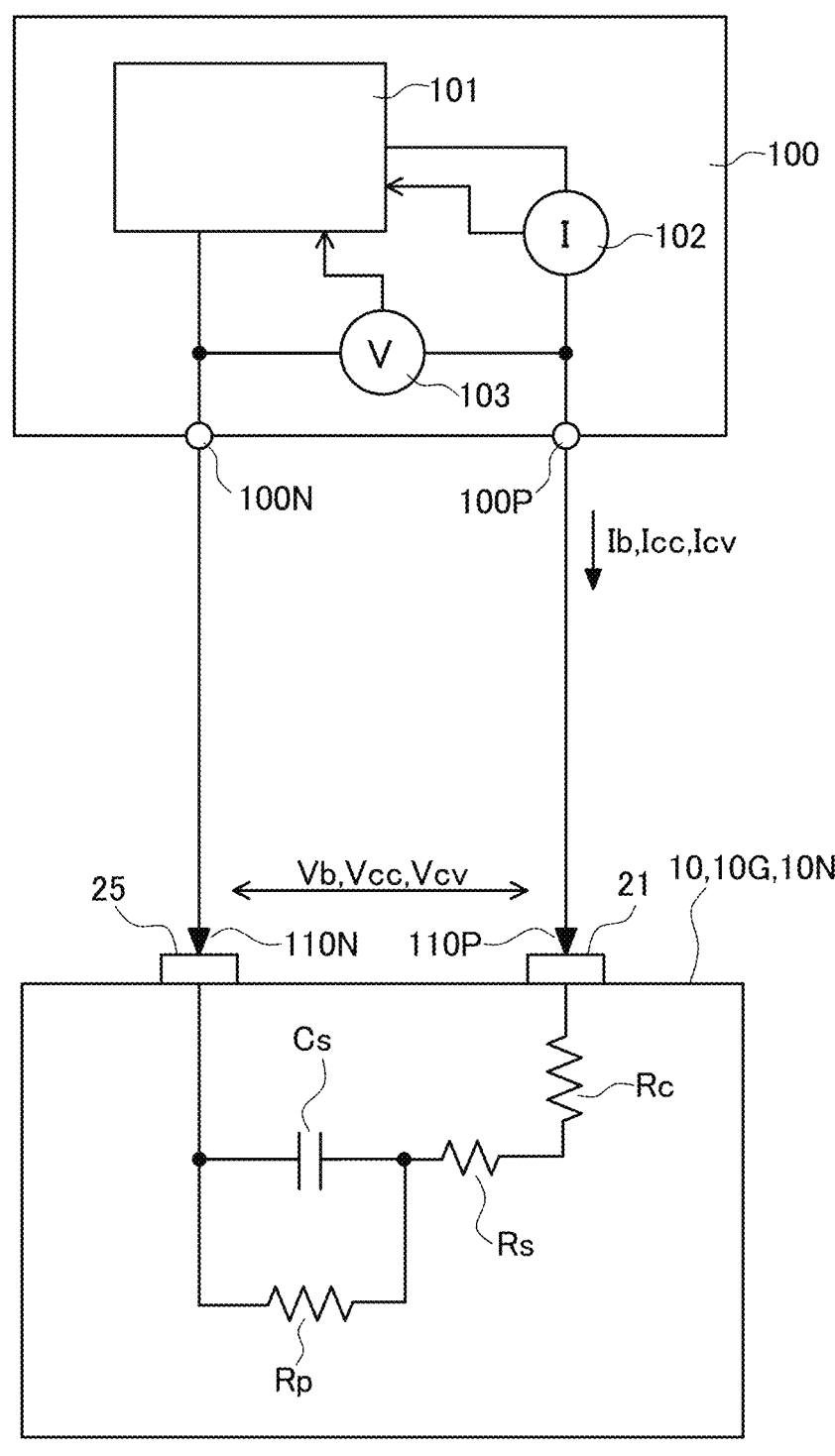
FIG. 2 is an equivalent circuit in which a DC power supply is connected to the battery in the embodiment and the first and second modified examples.

On the other hand, in DC terms, the battery 10 is represented by an equivalent circuit shown in FIG. 2. Specifically, the equivalent circuit of the battery 10 consists of a capacitance component Cs of battery 10, a parallel resistance Rp that constitutes a circuit in parallel with the capacitance component Cs and corresponds to an insulation resistance of the electrode body, a series resistance Rs connected in series with the capacitance component Cs and the parallel resistance Rp and corresponds to the resistance component of each part, and the above-described connection resistance Rc connected in series with them. As described above, the magnitude of the connection resistance Rc varies depending on the connection state between the positive current collecting part 35 and the positive inner terminal member 22 and the connection state between the negative current collecting part 36 and the negative inner terminal member 26.

The variations in the battery voltage Vb and the battery current Ib over time, exhibited when the battery 10 is subjected to CCCV charging using the DC power supply 100, will be described below referring to a graph in FIG. 3.

At the timing of elapsed time T=0, CC charging by the DC power supply 100 is started on the battery 10 with an open circuit voltage, which is initially the first battery voltage Vb1. To be specific, for the duration of CC charging, a CC current Icc having a constant magnitude (e.g., 6C) is supplied as a battery current Ib from the DC power supply 100 to the battery 10 (Ib=Icc) until the battery voltage Vb reaches a switching voltage Vch (Vb=Vch).

As can be easily understood from the equivalent circuit in FIG. 2, when the CC current Icc flows in the battery 10, a voltage is generated in the series resistance Rs and the connection resistance Rc, so that the battery voltage Vb becomes slightly higher than the first battery voltage Vb1 immediately after the start of CC charging. Thereafter, as the battery 10 is progressively charged, the battery voltage Vb gradually increases.

Figure 3:
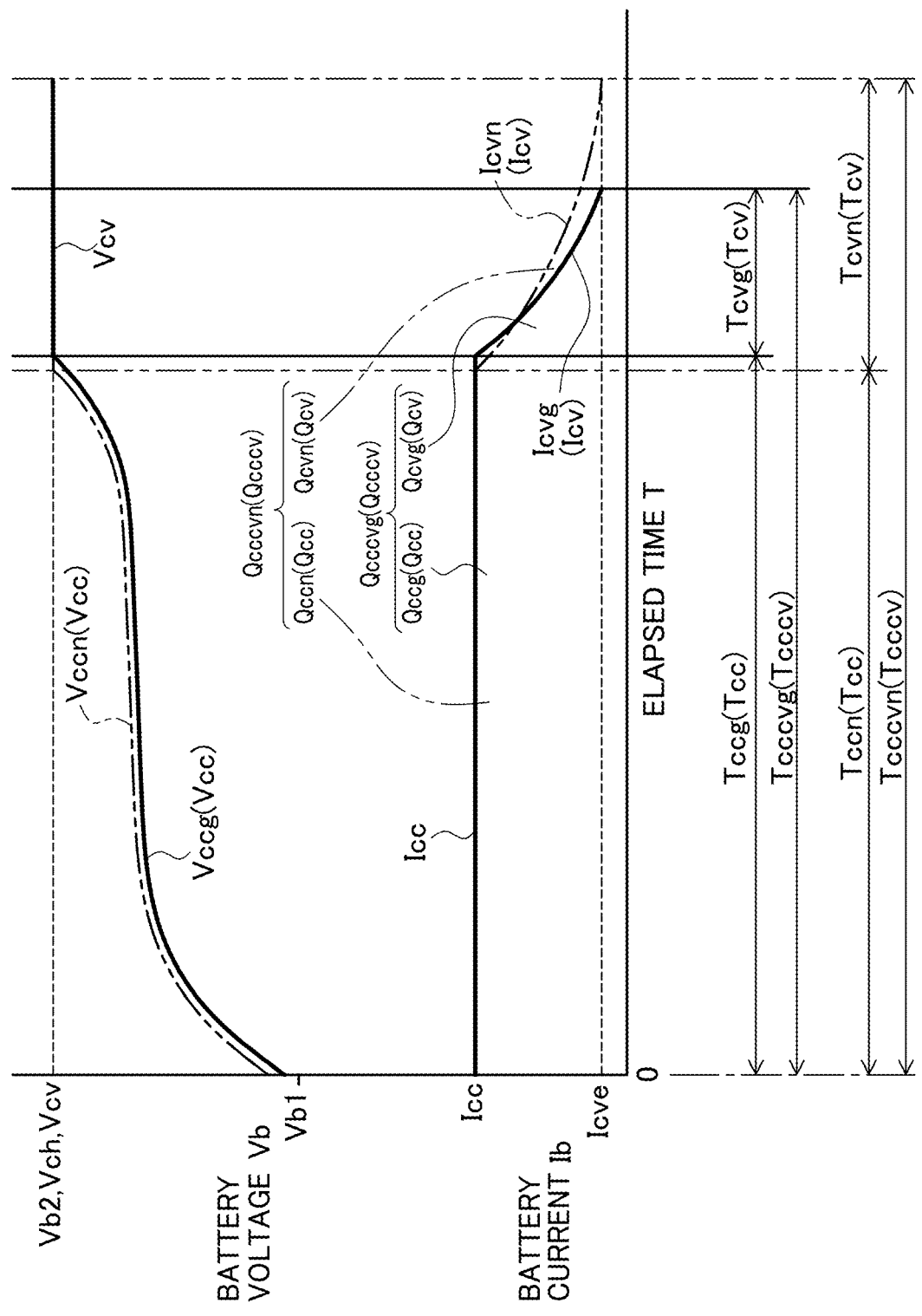
FIG. 3 is a graph showing variations in voltage and current over time during CCCV charging performed on the battery in the embodiment and the first modified example.
Figure 4:
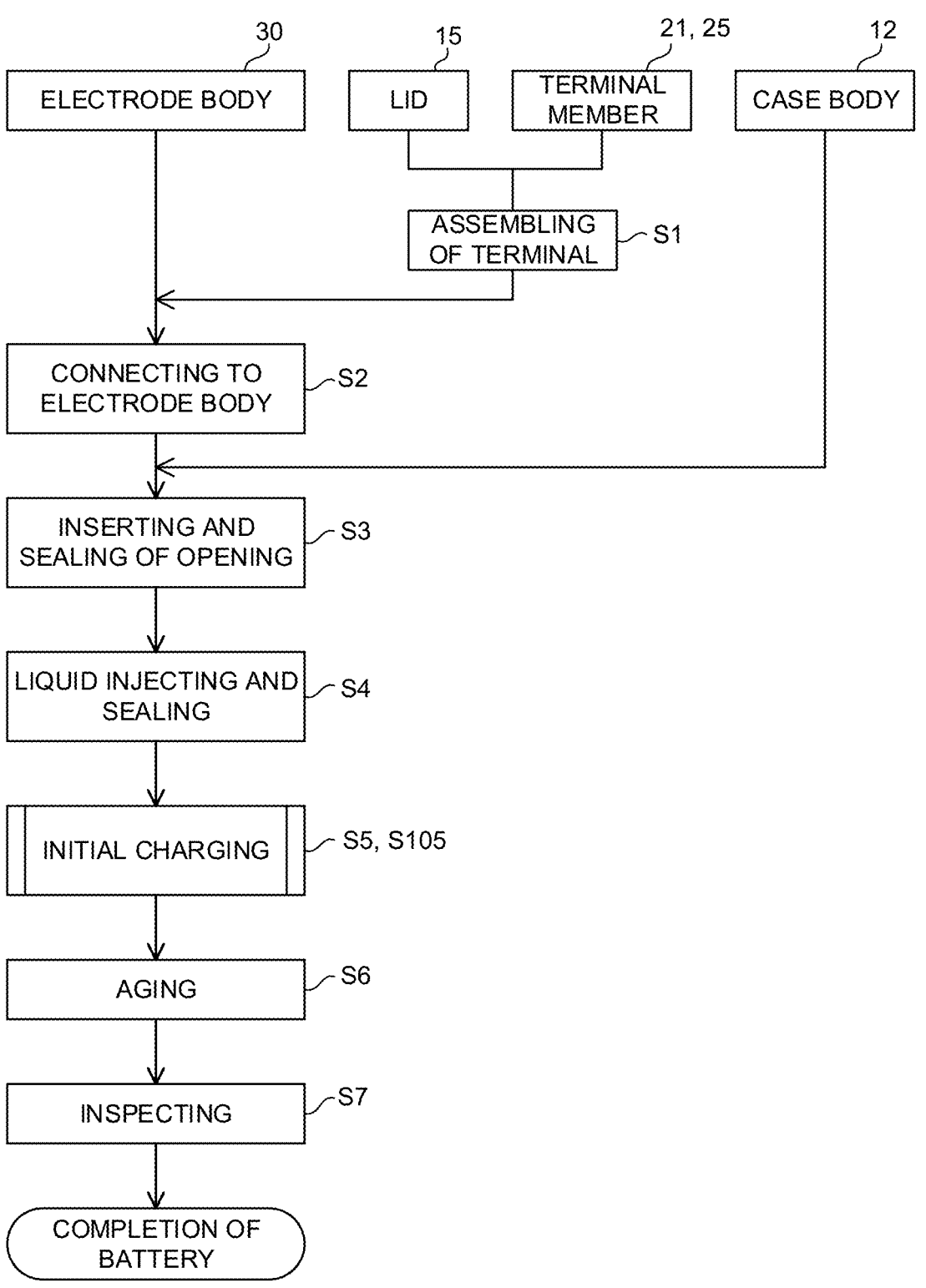
FIG. 4 is a flowchart showing a production process for the battery in the embodiment and the first and second modified examples.

However, as compared to the CC voltage Vccg of a non-defective battery 10G, which has good connection and a low connection resistance Rc, indicated by a thick solid line in the graph in FIG. 3, the CC voltage Vccn of a defective battery 10N, which has a high connection resistance Rc due to poor connection, indicated by a double-dotted chain line in the graph in FIG. 3, varies at a larger value by just that much of the voltage generated in the high connection resistance Rc.

Then, when the battery voltage Vb reaches the switching voltage Vch (Vb≥Vch), the DC power supply 100 terminates the CC charging and shifts to CV charging.

As can be easily understood from FIG. 3, comparing the CC time Tcc from the start of CC charging (T=0) until the battery voltage Vb of the battery 10 reaches the switching voltage Vch, the CC time Tccn of a defective battery 10N with high connection resistance Rc is shorter than the CC time Tccg of a non-defective battery 10G (Tccg>Tccn). This is because the battery voltage Vb reaches the switching voltage Vch earlier by just that much of the voltage generated in the high connection resistance Rc.

Meanwhile, comparing the CC electric quantity Qcc charged to the battery 10 by CC charging, the CC electric quantity Qccn of the defective battery 10N with high connection resistance Rc is smaller than the CC electric quantity Qccg of the non-defective battery 10G. This is because the duration of CC charging on the defective battery 10N is shorter than on the non-defective battery 10G. Thus, the defective battery 10N switches from CC charging to CV charging in a slightly uncharged state, as compared to the non-defective battery 10G.

During the subsequent CV charging, the DC power supply 100 maintains the battery voltage Vb at a CV voltage Vcv, which is equal to the switching voltage Vch (Vcv=Vch). The battery current Ib then becomes a CV current Icv varying with time in a gradually decreasing curve toward 0. In the present embodiment, CV charging is continued until the battery current Ib becomes equal to or lower than a CV termination current value Icve (e.g., 2C or less). As a result, the battery 10 is charged to the second battery voltage Vb2, which is approximately equal to the CV voltage Vcv.

However, comparing the CV current Icv flowing in the battery 10 during CV charging, the CV current Icvg of the non-defective battery 10G, indicated by the thick solid line in the graph in FIG. 3, early decreases in magnitude. In contrast, the CV current Icvn of the defective battery 10, indicated by the double-dotted chain line, decreases in magnitude relatively slowly as compared to the CV current Icvg of the non-defective battery 10. Therefore, regarding the CV time Tcv from the start of CV charging until the CV current Icv decreases to the CV termination current value Icve or less, the CV time Tcvn of the defective battery 10N is longer than the CV time Tcvg of the non-defective battery 10G (Tcvg<Tcvn).

Therefore, comparing the CV electric quantity Qcv of the CV charged battery 10 (corresponding to the area under the line plotting the CV current Icv in FIG. 3), the CV electric quantity Qcvn of the defective battery 10N is larger than the CV electric quantity Qcvg of the non-defective battery 10G with low connection resistance Rc. This is because the CV time Tcvn is longer than the CV time Tcvg, and the CV current of the defective battery 10N remains large. It is also conceivable that the defective battery 10N in somewhat undercharged state started to be charged by CV charging, so that the defective battery 10N has been charged with a larger electric quantity than the non-defective battery 10G during CV charging.

The total time of the CC time Tcc (Tccg, Tccn) and the CV time Tcv (Tcvg, Tcvn) is referred to as a CCCV time Tcccv (Tcccvg, Tcccvn) (Tcccv=Tcc+Tcv).

As can be seen from the graph in FIG. 3, regarding the CC time Tcc, the CC time Tccn of the defective battery 10N is shorter than the CC time Tccg of the non-defective battery 10G (Tccg>Tccn). In contrast, regarding the CV time Tcv, the CV time Tcvn of the defective battery 10N is longer than the CV time Tcvg of the non-defective battery 10G (Tcvg<Tcvn). It is understood from the above fact that, for the CCCV time Tcccv, which is the sum of the above CC and CV times, a difference between the CCCV time Tcccvg of the non-defective battery 10G and the CCCV time Tcccvn of the defective battery 10N is smaller than a difference in CV time Tcv between the defective battery 10N and the non-defective battery 10G.

Furthermore, the total electric quantity of the CC electric quantity Qcc (Qccg, Qccn) and the CV electric quantity Qcv (Qcvg, Qcvn) is referred to as a CCCV electric quantity Qcccv (Qcccvg, Qcccvn) (Qcccv=Qcc+Qcv).

As can be seen from the graph in FIG. 3, regarding the CC electric quantity Qcc, the CC electric quantity Qccn of the defective battery 10N is smaller than the CC electric quantity Qccg of the non-defective battery 10G (Qccg>Qccn). In contrast, regarding the CV electric quantity Qcv, the CV electric quantity Qcvn of the defective battery 10N is larger than the CV electric quantity Qcvg of the non-defective battery 10G (Qcvg<Qcvn). It is understood from the above fact that, for the CCCV electric quantity Qcccv, which is the sum of the above CC and CV electric quantities, a difference between the CCCV electric quantity Qcccvg of the non-defective battery and the CCCV electric quantity Qcccvn of the defective battery 10N is smaller than a difference in CV electric quantity Qcv between the defective battery 10N and the non-defective battery 10G.

From the above-mentioned understanding, in the present embodiment, a quantity ratio EPQ of CV electric quantity/CC electric quantity is calculated by dividing the CV electric quantity Qcv by the CC electric quantity Qcc, and the connection resistance Rc of the battery 10 under inspection is evaluated with this quantity ratio EPQ (=Qcv/Qcc) as an evaluation value.

As described above, the CV electric quantity Qcvn of the defective battery 10N is larger than the CV electric quantity Qcvg of the non-defective battery 10G (Qcvg<Qcvn), whereas the CC electric quantity Qccn of the defective battery 10N is smaller than the CC electric quantity Qccg of the non-defective battery 10G (Qccg>Qccn). Accordingly, using the quantity ratio EPQ (=Qcv/Qcc), the quantity ratio EPQ (=Qcv/Qcc) of the inspected battery 10 is likely to be even larger in magnitude in a defective battery 10N than in a non-defective battery 10G, clarifying a difference in the connection resistance Rc between the non-defective battery 10G and the defective battery 10N. This makes it possible to easily evaluate the level, high or low, of the connection resistance Rc.

In the present embodiment, furthermore, the battery 10 is produced in a production process incorporating the above-described method for evaluating the connection resistance Rc of the battery 10. Specifically, CCCV charging is performed in an initial charging step S5 described later, functioning as a sorting step of evaluating the connection resistance Rc and sorting out the battery 10 in the production stage. Firstly, the production process of the battery 10 in the present embodiment will be outlined below with referent to FIGS. 1 to 4.

The positive inner terminal member 22, the negative inner terminal member 26, and other components for the positive terminal 21 and the negative terminal 25, and the lid 15 are prepared first. In a terminal assembling step S1, those positive terminal 21 and negative terminal 25 are assembled and fixed to the lid 15.

In an electrode-body connecting step S2, the electrode body 30 formed in advance is connected to the positive terminal 21 and the negative terminal 25. Specifically, the connection portions 35C of the positive current collecting part 35 of the electrode body 30 and the connection part 22C of the positive inner terminal member 22 of the positive terminal 21 are connected to each other by laser welding. Further, the connection portions 36C of the negative current collecting part 36 of the electrode body 30 and the connection part 26C of the negative inner terminal member 26 are connected to each other by laser welding. As a result, the electrode body 30 is held by the lid 15 through the positive terminal 21 and the negative terminal 25, and the positive electrode sheet 31 of the electrode body 30 is connected and electrically conducted to the positive terminal 21 and the negative electrode sheet 32 of the electrode body 30 is connected and electrically conducted to the negative terminal 25.

In an inserting and sealing step S3, the electrode body 30 is inserted into the case body 12 through the opening 12P, and then the opening 12P is sealed with the lid 15. Specifically, the lid 15 is welded to the opening 12P of the case body 12 by laser welding.

Subsequently, the electrolyte 40 is injected into the case 11 through the liquid inlet 15H of the lid 15, and then the liquid inlet 15H is sealed with the stopper 16. Thus, an uncharged battery 10 is completed. This sealing of the liquid inlet 15H with the stopper 16 may be performed at an appropriate time in an initial charging step S5 to an inspecting step S7, which will be described below.

In the initial charging step S5, the uncharged battery 10 is charged. In the present embodiment, as described below, the connection resistance Rc of the battery is evaluated in this initial charging step S5. Therefore, the initial charging step S5 also functions as a sorting step to sort out the battery 10.

The battery 10 is then left to stand in a high-temperature environment in an aging step S6, and thereafter subjected to various inspections in the inspecting step S7. The final battery 10 is thus completed.

Figure 5:
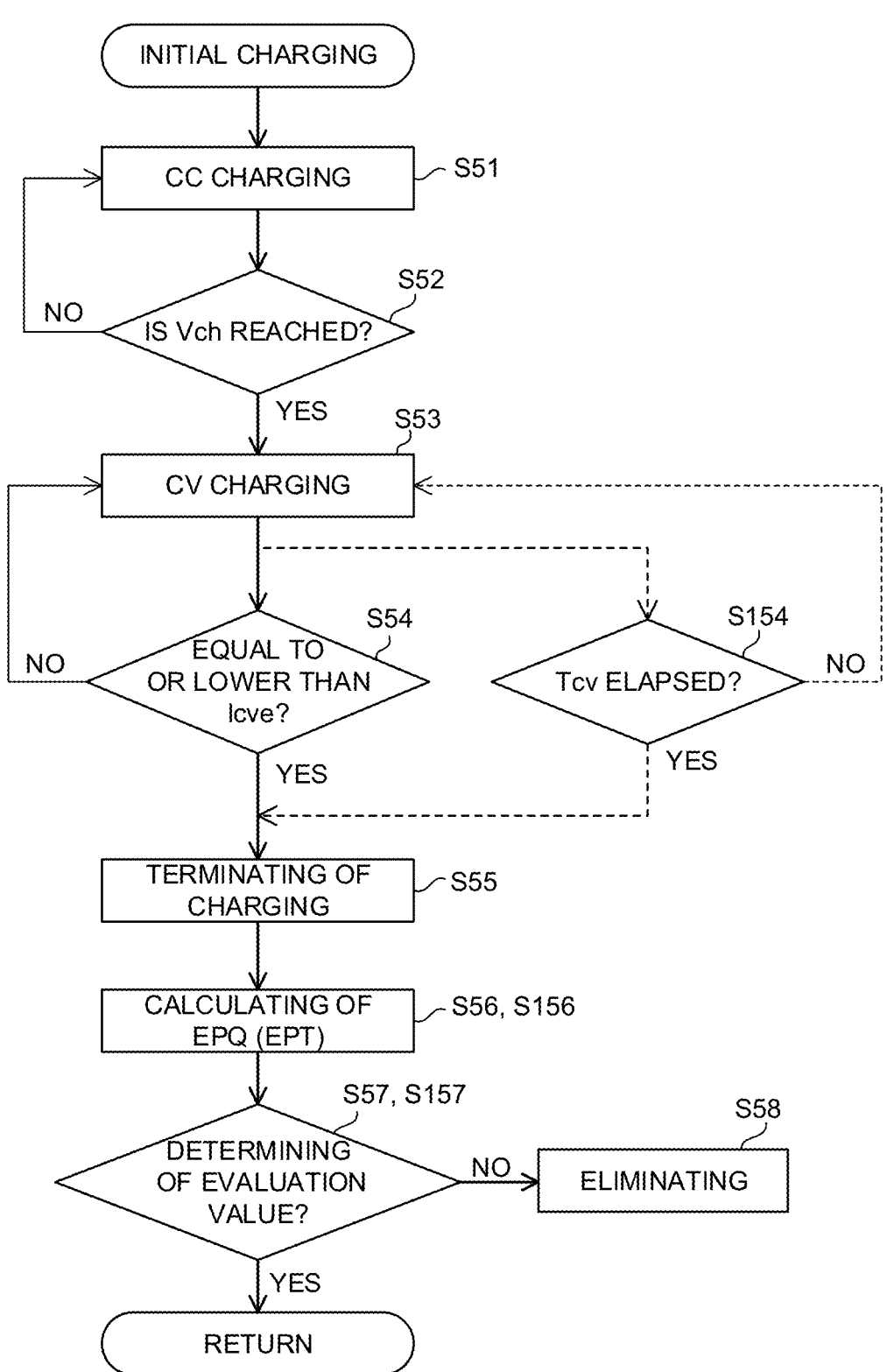
FIG. 5 is a flowchart showing the details of an initial charging step of the production process for the battery in the embodiment and the first and second modified examples.

The details of the aforementioned initial charging step S5 are described with reference to FIGS. 2, 3, and 5. In a CC charging step S51, the DC power supply 100 is connected to an uncharged battery 10 in a 25° C.-environment, and CC charging is performed to apply a predetermined CC current Icc (Icc=6C in this embodiment) to the battery 10. The DC power supply 100 is configured to detect the elapsed time T of each step and besides continuously detect the battery current Ib through the current measurement unit 102 and the battery voltage Vb through the voltage measurement unit 103, and thus integrate, or accumulate, battery currents Ib to obtain an electric quantity in each step.

In a switching judging step S52, it is judged whether the battery voltage Vb has reached, that is, is equal to or higher than, the switching voltage Vch. If NO in S52, that is, the battery voltage Vb has not reached the switching voltage Vch, the process returns to the CC charging step S51 to continue the CC charging step S51. In contrast, if YES in S52, that is, the battery voltage Vb has reached the switching voltage Vch or higher, the CC charging step S51 is terminated and the next CV charging step S53 is started.

In a CV charging step S53, the DC power supply 100 maintains the battery voltage Vb at a CV voltage Vcv equal to the switching voltage Vch (Vcv=Vch). In this CV charging step S53, the CV current Icv (i.e., the battery current Ib) varies with time in a gradually decreasing curve toward 0.

In a subsequent termination judging step S54, it is judged whether the battery current Ib is equal to or lower than the CV termination current value Icve (Icve≤2C in this embodiment). If NO in S54, that is, the battery current Ib is higher than the CV termination current value Icve, the process returns to the CV charging step S53 to continue the CV charging step S53. In contrast, if YES in S54, that is, the battery current Ib is equal to or lower than the CV termination current value Icve, the process then advances to the charging terminating step S55.

In a charging terminating step S55, the CV charging step S53 is terminated and the entire CCCV charging is also terminated.

In an evaluation value calculating step S56, the evaluation value, i.e., the quantity ratio EPQ of CV electric quantity/CC electric quantity (=Qcv/Qcc), is calculated for the battery 10 having been subjected to CCCV charging. The evaluation value calculating step S56 is one example of an evaluation value obtaining step of the present disclosure.

In an evaluation value determining step S57 in the present embodiment, the quality determination of the quantity ratio EPQ of the inspected battery 10 is made using an appropriately determined threshold value. Specifically, when the quantity ratio EPQ is equal to or larger than the threshold value, the inspected battery 10 is considered to be a defective battery 10N with high connection resistance Rc and thus a determination result is NO, and then this battery 10 is eliminated from the production process in a subsequent eliminating step S58. In contrast, when the quantity ratio EPQ is smaller than the threshold value, the inspected battery 10 is considered to be a non-defective battery 10G with low connection resistance Rc and successful connection, and a determination result is YES, and the process returns to the main routine and advances to the aging step S6.

Consequently, the method for producing the battery 10 in the present embodiment can produce the non-defective battery 10G with low connection resistance Rc while eliminating the defective battery 10N with high connection resistance Rc.

In the embodiment described above, in the evaluation value determining step S57, the quantity ratio EPQ of the battery 10 is evaluated by quality determination using the threshold value. As an alternative, the battery 10 may be evaluated by the stratified evaluation that classifies the quantity ratio EPQ into three or more ranks, as mentioned above.

First Modified Example

In the foregoing embodiment, in the evaluation value calculating step S56, the inspected battery 10 is evaluated using the quantity ratio EPQ of CV electric quantity/CC electric quantity (=Qcv/Qcc) as the evaluation value.

In contrast, the battery 10 may be evaluated using an evaluation value calculated in another manner. For example, in a first modified example, a time ratio EPT of CV time/CC time (=Tcv/Tcc) is used to evaluate the battery 10. That is, as in the foregoing embodiment, CCCV charging is terminated in the charging terminating step S55.

In the next evaluation value calculating step S56, for the battery 10 having been subjected to CCCV charging, the time ratio EPT of CV time/CC time (=Tcv/Tcc) is calculated as an evaluation value, instead of the quantity ratio EPQ.

In the evaluation value determining step S57, the quality determination of the time ratio EPT of the inspected battery 10 is made using an appropriately determined threshold value. Specifically, when the time ratio EPT is equal to or larger than the threshold value, the inspected battery 10 is considered to be a defective battery 10N and thus a determination result is NO, and the process advances to the eliminating step S58 to eliminate this battery 10 from the production process. In contrast, when the time ratio EPT is smaller than the threshold value, the inspected battery 10 is considered to be a non-defective battery 10G and thus a determination result is YES, and the process returns to the main routine and advances to the aging step S6.

Consequently, the method for producing the battery 10 in the present modified example can produce the non-defective battery 10G with low connection resistance Rc while eliminating the defective battery 10N with high connection resistance Rc. Instead of the above-described quality determination of the battery 10 based on the time ratio EPT, the battery 10 may be evaluated by the stratified evaluation that classifies the time ratio EPT into three or more ranks, as mentioned above.

Second Modified Example

In the foregoing embodiment and the first modified example, the magnitude of CV current Icv is set as the termination condition of the CV charging. Specifically, in the termination judging step S54 following the CV charging step S53 of the initial charging step S5, it is repeatedly determined whether the CV current Icv is equal to or lower than the CV termination current value Icve and, if YES in S54, the CV charging is terminated in the charging terminating step S55. Accordingly, as can be seen from FIG. 3, regardless of whether the inspected battery 10 is a non-defective battery 10G or a defective battery 10N, the CV current Icv for terminating the CV charging step S53 is the same CV termination current value Icve. However, the length of the CV time Tcv (Tcvg, Tcvn) are different from each other.

In contrast, in the second modified example (see FIG. 6), the CV time Tcv is set as the termination condition of the CV charging. Specifically, in an initial charging step S105, instead of the termination judging step S54, a termination judging step S154 indicated by a dashed line is performed after the CV charging step S53 to determine whether or not the CV time Tcv exceeds the predetermined CV time Tcv. If NO in S154, that is, the predetermined CV time Tcv has not yet elapsed from the time of switching from CC charging to CV charging, the process returns to the CV charging step S53 to continue the CV charging step S53. In contrast, if YES in S154, that is, the predetermined CV time Tcv has elapsed from the time of switching from CC charging to CV charging, the CV charging is terminated in the charging terminating step S55.

Figure 6:
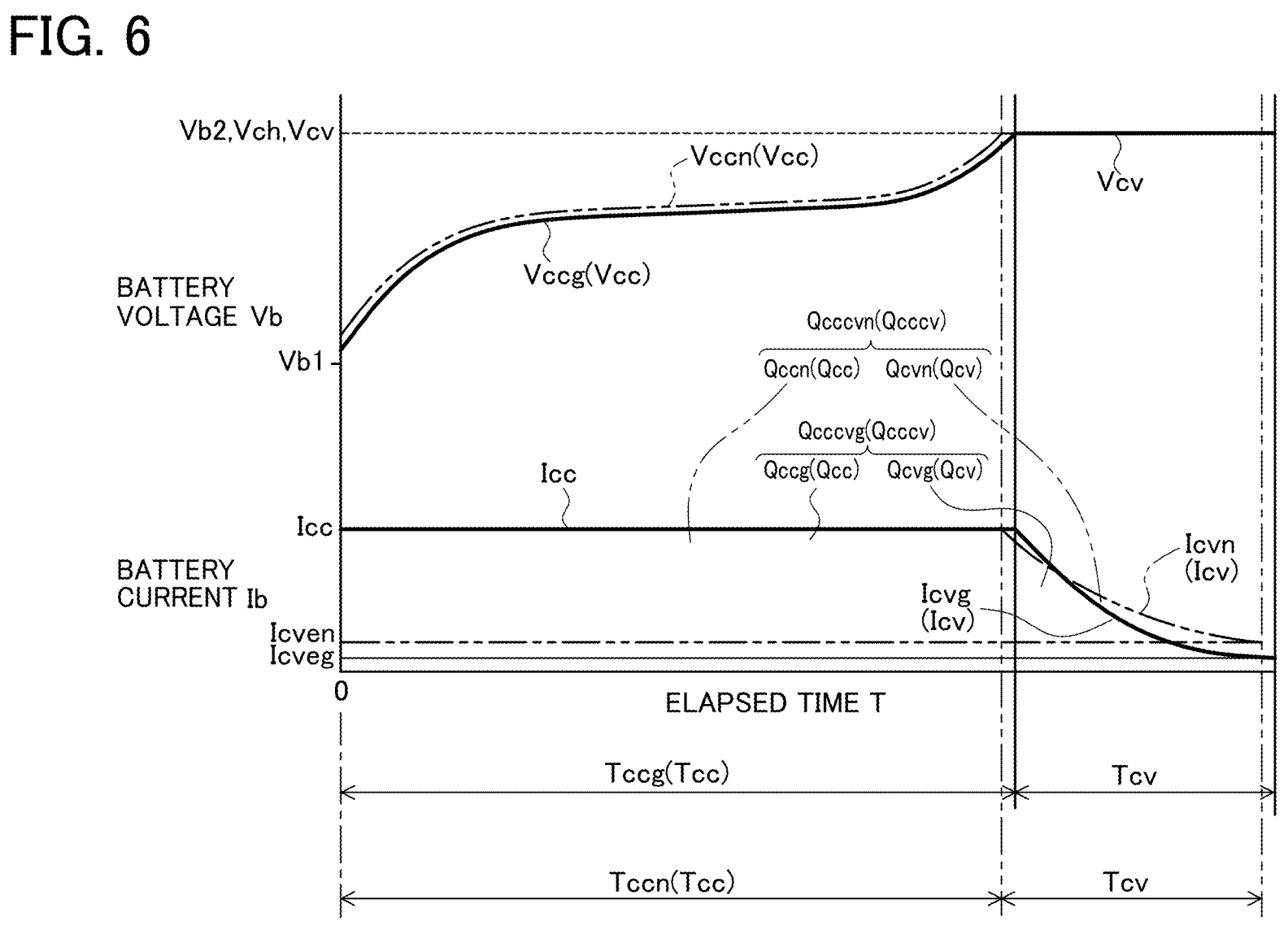

Accordingly, as can be easily understood from FIG. 6, the CV time Tcv from start to end of the CV charging step S53 is the same length regardless of whether the inspected battery 10 is a non-defective battery 10G or a defective battery 10N. However, the magnitude of the CV termination current value Icve (Icveg, Icven) is different between the non-defective battery 10G and the defective battery 10N.

To be concrete, comparing the CV current Icv flowing in the battery 10 during the CV charging, the CV current Icvg of the non-defective battery 10G, indicated by the thick solid line in the graph in FIG. 6, decreases in magnitude early. In contrast, the CV current Icvn of the defective battery 10, indicated by the double-dotted chain line, decreases in magnitude relatively slowly compared to the CV current Icvg of the non-defective battery 10. Therefore, at the time when the same CV time Tcv elapses from the start of CV charging, the CV termination current Icven of the defective battery 10N is larger than the CV termination current Icveg of the non-defective battery 10G (Icveg<Icven).

In this case, as in the foregoing embodiment, as can be seen from the graph in FIG. 6, regarding the CC electric quantity Qcc, the CC electric quantity Qccn of the defective battery 10N is smaller than the CC electric quantity Qccg of the non-defective battery 10G (Qccg>Qccn). In contrast, regarding the CV electric quantity Qcv, the CV electric quantity Qcvn of the defective battery 10N is larger than the CV electric quantity Qcvg of the non-defective battery 10G (Qcvg<Qcvn).

In an evaluation value calculating step S156, the quantity ratio EPQ of CV electric quantity/CC electric quantity (=Qcv/Qcc) is calculated as an evaluation value for the battery 10 having been subjected to CCCV charging, as in the foregoing embodiment.

In a subsequent evaluation value determining step S157, the quality determination of the quantity ratio EPQ of the inspected battery 10 is made using an appropriately determined threshold value. Specifically, when the quantity ratio EPQ is equal to or larger than the threshold value, the inspected battery 10 is considered to be a defective battery 10N and thus a determination result is NO, and this battery 10 is eliminated from the production process in the subsequent eliminating step S58. In contrast, when the quantity ratio EPQ is smaller than the threshold value, the inspected battery 10 is considered to be a non-defective battery 10G and thus a determination result is YES, and the process returns to the main routine and advances to the aging step S6.

Consequently, the method for producing the battery 10 in the second modified example can also produce a non-defective battery 10G with low connection resistance Rc while eliminating a defective battery 10N with high connection resistance Rc. Instead of determining the quality of the battery 10 based on the quantity ratio EPQ described above, the battery 10 may be evaluated by the stratified evaluation that classifies the quantity ratio EPQ into three or more ranks, as described above.

The present disclosure is described in the foregoing embodiment and first and second modified examples but is not limited thereto. The present disclosure may be embodied in other specific forms without departing from the essential characteristics thereof.

For example, in the embodiment and the second modified example, the battery 10 is evaluated using the quantity ratio EPQ of CV electric quantity/CC electric quantity (=Qcv/Qcc) as the evaluation value. In the first modified example, the time ratio EPT of CV time/CC time (=Tcv/Tcc) is used as the evaluation value to evaluate the battery 10.

However, evaluation values for evaluating the connection resistance Rc of the inspected battery 10 only have to be obtained by use of at least two values from among CC electric quantity Qcc, CV electric quantity Qcv, CCCV electric quantity Qcccv, CC time Tcc, CV time Tcv, CCCV time Tcccv, and CV termination current value Icve. For instance, the evaluation value may be the quantity ratio of CC electric quantity/CV electric quantity (=Qcc/Qcv), which is the inverse ratio of the quantity ratio EPQ, and the time ratio of CC time/CV time (=Tcc/Tcv), which is the inverse ratio of the time ratio EPT. Further, the evaluation values for evaluating the connection resistance Rc of the inspected battery 10 may include for example the quantity ratio of CV electric quantity/CCCV electric quantity, the time ratio of CV time/CCCV time, the ratio of CV termination current value/CC electric quantity, and (CC electric quantity–CV electric quantity)·(CC time–CV time).

The foregoing embodiment, and first and second modified examples exemplify the evaluation of the connection resistance Rc by utilizing CCCV charging in the initial charging step S5 or S105 in the production process of the battery 10. As an alternative, the connection resistance Rc of the inspected battery 10 may be evaluated by performing another CCCV charging in the inspecting step after the initial charging step.

In the embodiment and modified examples described above, CCCV charging is performed to obtain the evaluation values, such as the quantity ratio EPQ and time ratio EPT, and those evaluation value are used to evaluate the connection resistance Rc of the battery 10. As an alternative, however, CCCV discharging may be performed on a battery 10 already charged by for example initial charging to obtain measured values, for example, CC time Tcc, CV time Tcv, CC electric quantity Qcc, CV electric quantity Qcv, and others, and evaluation values such as the quantity ratio EPQ and time ratio EPT are obtained from the above measured values to evaluate the connection resistance Rc of the battery 10.

Moreover, it is possible not only to evaluate the connection resistance Rc of a battery 10 to be produced in the production process of the battery 10, but also evaluate the connection resistance Rc of an already used battery 10 based on evaluation values for evaluating the connection resistance Rc, which are obtained by CCCV charging or CCCV discharging on the battery 10.

REFERENCE SIGNS LIST

10 Battery (Power storage device)
10G Non-defective battery
10N Defective battery
21 Positive terminal

22 Positive inner terminal member (Terminal member)
22C Connection part (of positive terminal member)
25 Negative terminal
26 Negative inner terminal member (Terminal member)
26C Connection part (of negative terminal member)
30 Electrode body
34 Main part
35 Positive current collecting part (Current collecting part)
35C Connection portion (of positive current collecting part)
36 Negative current collecting part (Current collecting part)
36C Connection portion (of negative current collecting part)
Cs Capacity component (of battery)
Rs Series resistance (of battery)
Rc Connection resistance (between current collecting part and terminal member)
100 DC power supply
101 Power supply unit
102 Current measurement unit
103 Voltage measurement unit
Ib Battery current (Device voltage)
Vb Battery voltage
Vb1 First battery voltage (First device voltage)
Vb2 Second battery voltage (Second device voltage)
T Elapsed time T
Tcc, Tccg, Tccn CC time
Tcv, Tcvg, Tcvn CV time
Tcccv, Tcccvg, Tcccvn CCCV time
Icc CC current
Vcc, Vccg, Vccn CC voltage
Vch Switching voltage
Icv, Icvg, Icvn CV current
Icve, Icveg, Icven CV termination current value
Vcv, Vcvg, Vcvn CV voltage
Qcc, Qccg, Qccn CC electric quantity
Qcv, Qcvg, Qcvn CV electric quantity
Qcccv, Qcccvg, Qcccvn CCCV electric quantity
EPQ Quantity ratio (Evaluation value)
EPT Time ratio (Evaluation value)
S5, S105 Initial charging step (Sorting step)
S51 CC charging step
S52 Switching determining step
S53 CV charging step
S54, S154 Termination determining step
S55 Charging terminating step
S56, S156 Evaluation value calculating step (Evaluation value obtaining step)
S57, S157 Evaluation value determining step
S58 Eliminating step

What is claimed is:

1. A method for evaluating a power storage device by evaluating connection resistance between a current collecting part of an electrode body and a terminal member connected to the current collecting part in the power storage device, wherein the method comprises:

changing a device voltage of the power storage device from a first device voltage to a second device voltage by constant-current constant-voltage (CCCV) charging or CCCV discharging;

obtaining any one of a quantity ratio of constant voltage (CV) electric quantity/constant current (CC) electric quantity, a time ratio of CV time/CC time, a quantity ratio of CV electric quantity/CCCV electric quantity, a time ratio of CV time/CCCV time, a ratio of the CV termination current value/CC electric quantity, a time ratio of the CV termination current value/CC time, a quantity ratio of CC electric quantity/CV electric quantity, a quantity ratio of CCCV electric quantity/CV electric quantity, a time ratio of CCCV time/CV time, CC electric quantity/CV termination current value, CC time/CV termination current value, a quantity ratio of CC electric quantity/CV electric quantity, (CC electric quantity-CV electric quantity)×(CC time-CV time), as an evaluation value for evaluating the connection resistance by use of at least two values from among CC electric quantity, CV electric quantity, CCCV electric quantity, CC time, CV time, CCCV time, and CV termination current value of the power storage device, which are obtained in the changing of the device voltage;

evaluating the connection resistance of the power storage device based on the evaluation value; and eliminating the power storage device as defective in response to the evaluated connection resistance exceeding a threshold value.

2. The method for evaluating a power storage device according to claim 1, wherein
in the obtaining of the evaluation value,
a quantity ratio of CV electric quantity/CC electric quantity is obtained as the evaluation value.

3. The method for evaluating a power storage device according to claim 1, wherein
in the obtaining of the evaluation value,
a time ratio of CV time/CC time is obtained as the evaluation value.

4. A method for producing a power storage device, the method comprising sorting the connection resistance of the power storage device by the method for evaluating the power storage device set forth in claim 1.

5. A method for producing a power storage device, the method comprising sorting the connection resistance of the power storage device by the method for evaluating the power storage device set forth in claim 2.

6. A method for producing a power storage device, the method comprising sorting the connection resistance of the power storage device by the method for evaluating the power storage device set forth in claim 3.

\*    \*    \*    \*    \*